(12) United States Patent
Lee et al.

(10) Patent No.: US 8,293,458 B2
(45) Date of Patent: Oct. 23, 2012

(54) METHOD FOR FORMING FINE PATTERN IN SEMICONDUCTOR DEVICE

(75) Inventors: Jun-Gyeong Lee, Daejeon (KR);
Jung-Youl Lee, Anyang-Si (KR);
Jeong-Sik Kim, Hwaseong-Si (KR);
Eu-Jean Jang, Hwaseong-Si (KR);
Jae-Woo Lee, Bucheon-Si (KR);
Deog-Bae Kim, Seoul (KR); Jae-Hyun Kim, Seoul (KR)

(73) Assignee: Dongjin Semichem .Co., Ltd. (KR)

( * ) Notice: Subject to any disclaimer, the term of this patent is extended or adjusted under 35 U.S.C. 154(b) by 361 days.

(21) Appl. No.: 12/618,530

(22) Filed: Nov. 13, 2009

(65) Prior Publication Data

US 2010/0233622 A1    Sep. 16, 2010

(30) Foreign Application Priority Data

Mar. 11, 2009  (KR) ............ 10-2009-0020837

(51) Int. Cl.
*G03F 7/00*      (2006.01)
*G03F 7/004*    (2006.01)
*G03F 7/40*      (2006.01)

(52) U.S. Cl. .......... 430/312; 430/270.1; 430/322; 430/330; 430/331; 430/927

(58) Field of Classification Search ......... 430/270.1, 430/312, 322, 330, 331
See application file for complete search history.

(56) References Cited

U.S. PATENT DOCUMENTS

| | | | |
|---|---|---|---|
| 7,378,229 B2 * | 5/2008 | Endo et al. ............ | 430/322 |
| 8,084,186 B2 * | 12/2011 | Abdallah et al. ........ | 430/270.1 |
| 2004/0137241 A1 | 7/2004 | Lin et al. | |
| 2006/0073412 A1 | 4/2006 | Lee et al. | |
| 2009/0253080 A1 * | 10/2009 | Dammel et al. ......... | 430/324 |
| 2010/0040838 A1 * | 2/2010 | Abdallah et al. ........ | 428/195.1 |
| 2010/0086878 A1 * | 4/2010 | Hatakeyama et al. ..... | 430/324 |

FOREIGN PATENT DOCUMENTS

| | | |
|---|---|---|
| EP | 1596251 A1 | 11/2005 |
| EP | 2128706 A1 | 12/2009 |
| JP | 2000-347414 A | 12/2000 |
| WO | 2008/059440 A2 | 5/2008 |
| WO | 2008/114644 A1 | 9/2008 |
| WO | 2009/122276 A1 | 10/2009 |

OTHER PUBLICATIONS

European Search Report, PO 9070 EP-Meb, for Application No. 09013760.5-1226/2230552.
David J. Abdallah, et. al., "A Novel Resist Freeze Process for Double Imaging", Sematech proceedngs—5th International Symposium on Immersion Lithography Extentions, Sep. 25, 2008.
Andreas Erdmann, et. al., "Rigorous electromagnetic field simulation of to-beam interference exposures for the exploration of double patterning and double exposure scenarios", Proceedings of SPIE, vol. 6924, Jan. 1, 2008, pp. 692452-1-692452-12.

* cited by examiner

*Primary Examiner* — Amanda C. Walke
(74) *Attorney, Agent, or Firm* — Park & Associates IP Law, P.C.

(57) ABSTRACT

Disclosed is a method for manufacturing fine patterns of semiconductor devices using a double exposure patterning process for manufacturing the second photoresist patterns by simply exposing without an exposure mask. The method comprises the steps of: forming a first photoresist pattern on a semiconductor substrate on which a layer to be etched is formed; coating a composition for a mirror interlayer on the first photoresist pattern to form a mirror interlayer; forming a photoresist layer on the resultant; and forming a second photoresist pattern which is made by a scattered reflection of the mirror-interlayer and positioned between the first photoresist patterns, by exposing the photoresist layer to a light having energy which is lower than a threshold energy ($E_{th}$) of the photoresist layer without an exposure mask, and then developing the same.

19 Claims, 5 Drawing Sheets

METHOD FOR FORMING FINE PATTERN IN SEMICONDUCTOR DEVICE

REFERENCE TO RELATED APPLICATIONS

This application claims the priority benefit of Korean Patent Application No. 10-2009-0020837 filed on Mar. 11, 2009. The entire disclosure of the Korean Patent application is incorporated herein by reference.

FIELD OF THE INVENTION

The present invention relates to a method for manufacturing fine patterns of semiconductor devices, and more particularly, to a method for manufacturing fine patterns of semiconductor devices using a double exposure patterning process for manufacturing the second photoresist patterns by simply exposing without an exposure mask.

BACKGROUND OF THE INVENTION

For processing a semiconductor wafer or a display glass to a semiconductor chip or a display element, a designed electric circuit should be built on the semiconductor wafer or the display glass by using a photolithography process. As the circuit integration increases, high-resolution patterning is further required in the photolithography process. One of methods for obtaining the high-resolution pattern uses a light with short wavelength as an exposure source, main parameter for defining the resolution, and another method is to fill liquid having a refractive index larger than that of air between a photo sensitizer and a lens so as to make a numeral aperture (NA) over 1. Still another method is to make $k_1$, one of process parameters, less than 0.3 by introducing an additional process. In detail, KrF laser light whose wavelength is 248 nanometers is used as an exposure source to manufacture a 90-to-200-nanometer-device, and ArF laser light whose wavelength is 193 nanometers is used as an exposure source to produce a semiconductor chip with 60-to-90-nanometer-pattern resolution. In order to obtain a device having 40-to-60-nanometer-ultra fine pattern resolution, during the exposure, is used an immersion lithography process which makes the numeral aperture (NA) more than 1 by filing deionized (DI) water having 1.34 of a refractive index between a photoresist layer coated on a wafer and a projection lens, instead of air with 1 of a refractive index.

The technique under the study for manufacturing 30-nanometer device is a double patterning process which is a modification of a conventional single photolithography process. The double patterning process reduces a process parameter $k_1$ 0.25 and less by twice repeating the conventional single photolithography process, to form ultra-fine patterns. As another methods for reducing the process parameter $k_1$, there are a double expose patterning process (See: FIG. 1) and a spacer patterning technology (SPT) (see: FIG. 2). In the double expose patterning process, an exposure process is carried out twice to obtain a pattern with a desired resolution. In SPT, on a sacrifice pattern is formed a spacer by CVD (Chemical Vapor Deposition) after an initial exposure process, and then the sacrifice pattern is removed to obtain a pattern with a desired resolution.

However, the double expose patterning process has a problem that an overlay accuracy at the second exposure cannot be secured. In SPT employing an inorganic sacrifice layer, a CVD process and an etching process are further required so the SPT is more complicated and production cost highly increases. Also, in SPT employing an organic sacrifice layer, the thickness of sacrifice layer cannot be enough obtained.

In order to overcome those problems, the present invention discloses a self-consistent interlayer lithography process in which is employed a mirror interlayer having a larger refractive index than that of a second photoresist pattern and serving as a protecting layer of a first photoresist pattern during the formation of the second photoresist pattern. Also, the present invention discloses a composition of the mirror interlayer and a photoresist composition having a regulated sensitivity, which are used for the self-consistent interlayer lithography process.

SUMMARY OF THE INVENTION

Therefore, it is an object of the present invention to provide a method for forming a semiconductor fine-pattern which is free from the overlay accuracy, by forming a second photoresist pattern using a simple exposure without an exposure mask.

It is another object of the present invention to provide a method for forming a semiconductor fine-pattern in a simple and economical process.

In order to achieve these objects, the present invention provides a method for a semiconductor fine-pattern, comprising the steps of: forming a first photoresist pattern on a semiconductor substrate on which a layer to be etched (etching layer) is formed; coating a composition for a mirror interlayer on the first photoresist pattern to form a mirror interlayer; forming a photoresist layer on the resultant; and forming a second photoresist pattern which is made by a scattered reflection of the mirror interlayer between the first photoresist patterns, by exposing the photoresist layer to a light having energy which is lower than a threshold energy ($E_{th}$) of the photoresist layer without an exposure mask, and then developing the same.

The composition for a mirror interlayer selectively comprises, according to the coating method, only cross-linker or a mixture of cross-linker, polymer binder and solvent. The refractive index of the mirror interlayer to the light having energy which is lower than threshold energy ($E_{th}$) of the photoresist layer, is larger than the refractive index of the photoresist layer by 1-50%.

The present invention provides a photoresist composition comprising a photosensitive polymer represented by following Formula 7, a photo acid generator (PAG) and an organic solvent. The refractive index of the photoresist layer formed by the photoresist composition, to the light having energy which is lower than threshold energy ($E_{th}$) of the photoresist layer, is smaller than the refractive index of the mirror interlayer by 1-50%.

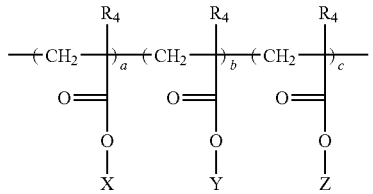

[Formula 7]

In Formula 7, $R_4$ is independently hydrogen atom or methyl group, and X, Y and Z are independently, $C_{1-25}$ chain- or-ring-structured aromatic or aliphatic hydrocarbon containing hetero atom of 0-20. a, b and c independently represent mol % of repeating units with respect to total monomers constituting the polymer, and are 10 to 75 mol %, 15 to 80 mol %, and 10 to 75 mol %, respectively.

The method for forming semiconductor patterns according to the present invention is a new self-align process without the overlay issue. The present method is not needed to form an organic or inorganic spacer unlike the conventional method such as the SPT and then employs an organic mirror interlayer which optically induces a scattered reflection without an exposure mask to form the second photoresist patterns which are controlled by the first photoresist patterns. Accordingly, the process for forming semiconductor patterns is further simple and the manufacturing cost can be economically reduced.

DETAILED DESCRIPTION OF THE INVENTION

A more complete appreciation of the invention, and many of the attendant advantages thereof, will be better appreciated by reference to the following detailed description.

The method for forming semiconductor patterns according to the present invention is a self-consistent interlayer lithography process (SCIL process) at which the second photoresist pattern is regulated by the first photoresist pattern. The SCIL process is a new self-align process which is not needed to form an organic or inorganic spacer unlike the conventional method such as the SPT and employs an organic mirror interlayer for inducing a scattered reflection.

Figure 4:
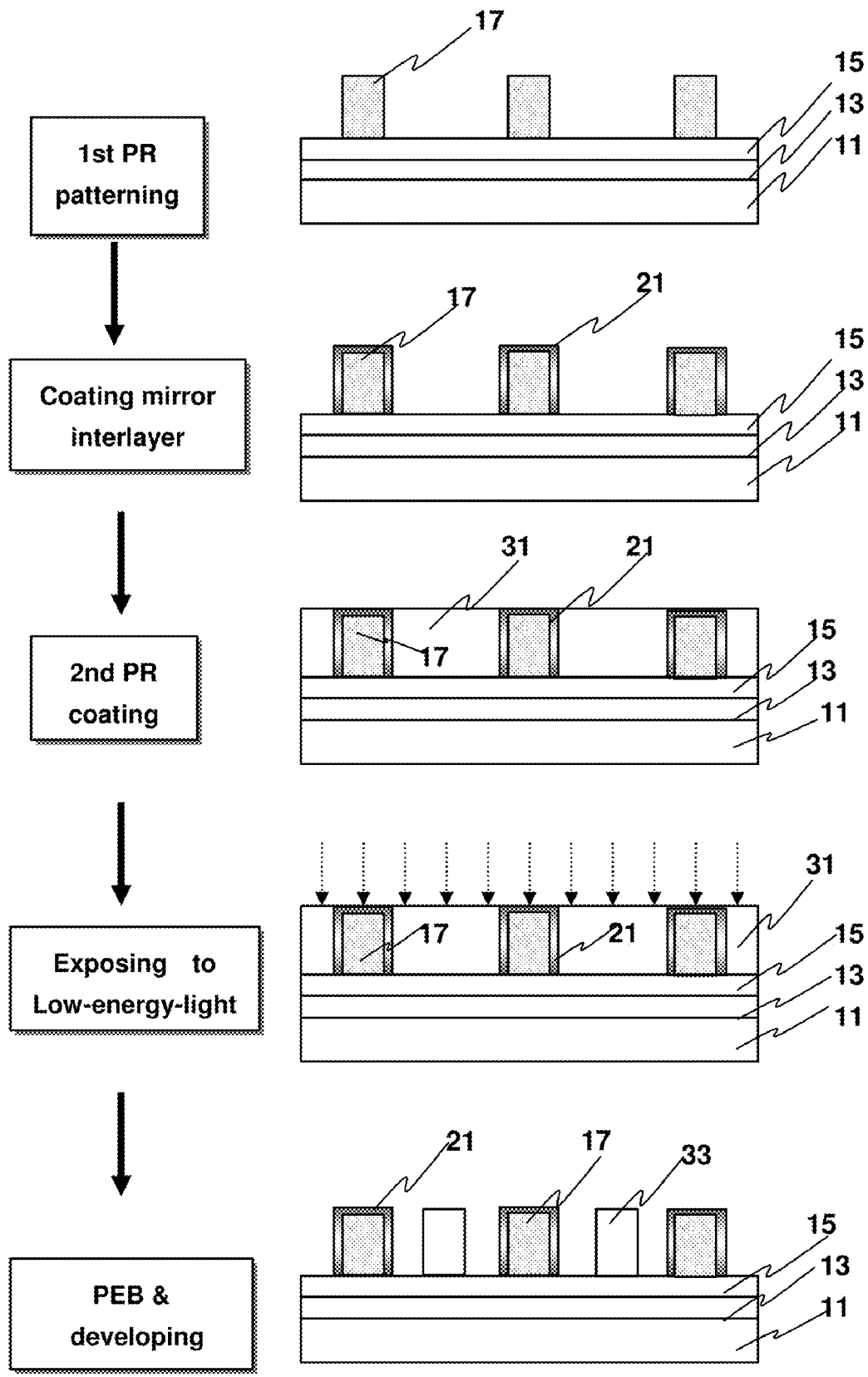
FIG. 4 is a drawing of sectional views for showing steps for forming semiconductor patterns according to a present invention.

FIG. 4 shows sectional views for illustrating steps for forming semiconductor patterns according to the SCIL process of the present invention. As shown in FIG. 4, the SCIL process comprises the steps of i) forming first photoresist patterns (17) on a semiconductor substrate (11) on which an etching layer (13) and an anti-reflection layer (15) which is formed at need, are formed, by using a conventional photolithography process after coating a first photoresist layer (not shown) ii) coating a composition for a mirror interlayer on the first photoresist patterns (17) to form a mirror interlayer (21), iii) forming a second photoresist layer (31) on the resultant, and iv) forming second photoresist patterns (33) which are made by a scattered reflection of the mirror interlayer (21) between the first photoresist patterns (17), by exposing the second photoresist layer (31) to a light having energy which is lower than a threshold energy ($E_{th}$) of the second photoresist layer (31) without an exposure mask, and then developing the same. Hereinafter "energy which is lower than threshold energy ($E_{th}$) of the photoresist layer" is referred to as "low energy".

The threshold energy ($E_{th}$) indicates sensitivity change of the photoresist layer in responsive to the changes of various factors affecting the process and is defined as an exposure energy when the exposure completion (in case of positive photoresist layer, when the photoresist is completely disappeared.) is identified by the remain-resist-thickness of the photoresist layer measured after exposing.

Figure 5:
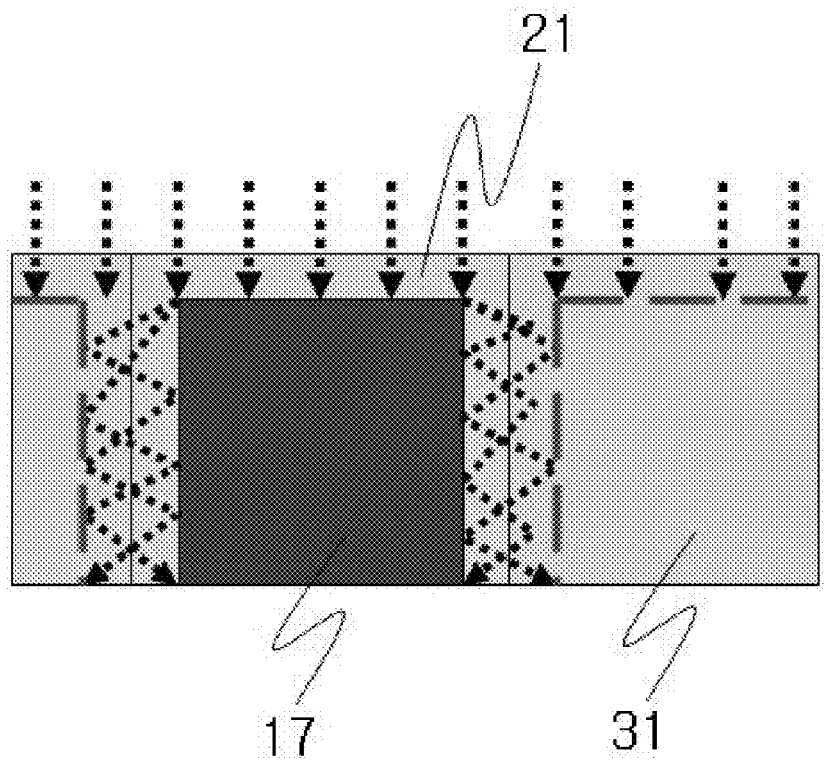
FIG. 5 is a sectional view for illustrating a scattered reflection by a mirror interlayer according to a present invention.

The composition for the mirror interlayer of the present invention is composed of, according to a coating method, a cross-linker only or a mixture of a cross-linker, binder polymer and solvent. The refractive index of the mirror interlayer, formed on the first photoresist patterns by using the mirror interlayer composition, with respect to a light having low energy, is larger than that of the second photoresist layer (31) by 1-50%, preferably 3-30%, more preferably 5-10%. The mirror interlayer (21) plays a role of a protecting layer for preventing the first photoresist patterns (17) from being dissolved in a solvent of the second photoresist composition when the second photoresist layer (31) is formed. Also the mirror interlayer (21) plays a role of inducing a scattered reflection by the first photoresist patterns (17) at the steps of exposing to a light having low energy when the second photoresist patterns (33) is formed, to form the second photoresist patterns (33) between the first photoresist patterns (17) (See FIG. 5). Though the light with low energy (low-energy light) cannot be reached to the bottom of the second photoresist layer (31), since the mirror interlayer (21) has high transmittance to the low-energy light, the scattered reflection is generated down to the bottom of the second photoresist layer (31) along the interface between the mirror interlayer (21) and the second photoresist layer (31). Owing to the scattered reflection at the interface, absorption energy of the second photoresist layer (31) at the interface is amplified and then the second photoresist patterns (33) can be formed.

When the refractive index of the mirror interlayer (21) is larger than that of the second photoresist layer (31) by less than 1%, the scattered reflection cannot be effectively generated because of the slight difference of the refractive index. When the refractive index of the mirror interlayer (21) is larger than that of the second photoresist layer (31) by more than 50%, the second photoresist patterns (33) cannot be formed owing to the excessive increase of the refractive index at the mirror interlayer. In addition, when the refractive index of the mirror interlayer (21) is same to or smaller than that of the second photoresist layer (31), the enough scattered reflection cannot be expected.

As an example of the coating method for forming the mirror interlayer (21), there are a coating method using evaporated cross-linker only and a coating method using solution composed of cross-linker, binder polymer and solvent. At the former, the semiconductor substrate (11) on which the first photoresist patterns (17) are formed is introduced in a reactor and the cross-linker is evaporated. Then the reactor is heated over 160° C. while the evaporated cross-linker is injected to the reactor so that the mirror interlayer (21) is formed by a cross-linking of polymer in the first photoresist patterns (17) and evaporated cross-linker. At the latter, the solution composed of cross-linker, binder polymer and solvent is coated on the first photoresist patterns (17) and the solvent and binder polymer are removed so that that the mirror interlayer (21) is formed by a cross-linking of polymer in the first photoresist patterns (17) and the cross-linker. The mirror interlayer (21) made of the cross-linker only shows good scattered reflection. For forming the mirror interlayer (21) having better scattered reflection effect, reflectivity enhancer can be added.

The cross-linker of the present invention, which is used to stably form the mirror interlayer through a cross-linking with the polymer in the first photoresist patterns (17), is selected from a group consisting of amine type compound represented by following Formula 1, alcohol type compound represented by following Formula 2, amide type compound represented by following Formula 3 and mixture thereof. Examples of the cross-linker include ethylenediamine, diethylenediamine, triethylenetetramine and triethylene glycol.

[Formula 1]

[Formula 2]

[Formula 3]

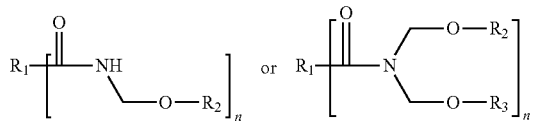

In Formula 1 to Formula 3, $R_1$ is chain-or-ring-structured aromatic or aliphatic hydrocarbon of C1-C10, preferably C2-C8, containing hetero atom of 0-5, preferably nitrogen atom and oxygen atom of 0-4. $R_2$ and $R_3$ are independently chain-or-ring-structured aromatic or aliphatic hydrocarbon of C1-C15; preferably C1-C10, containing hetero atom of 0-5, preferably 2-4.

The binder polymer of the present invention has excellent solubility with respect to a protic solvent and good mixing with a cross-linker and a refractivity enhancer. The binder polymer of the present invention comprises the repeating unit represented by following Formula 4, and weight-average molecular weight (Mw) thereof is 1,000 to 100,000, preferably 1,500 to 20,000.

[Formula 4]

In Formula 4, $R_4$ is hydrogen atom or methyl group($CH_3$), $R_5$ is chain-or-ring-structured aromatic or aliphatic hydrocarbon of C0-C10, preferably C0-C8, containing hetero atom of 1-5, preferably nitrogen atom (N), oxygen atom (O) and sulfur atom(S) of 1-4. m is an integer of 200 to 1000, preferably an integer of 250 to 800. The binder polymer of the present invention can be a copolymer containing at least 2 repeating units each being different form. For example, the binder polymer of the present invention can be homopolymer manufactured by monomer only selected from a group of acryl amide and derivative thereof, acrylic acid, allylamine and derivative thereof, vinyl alcohol and derivative thereof, vinyl sulfonic acid, 4-hydroxy styrene, N-vinyl-2-pyrrolidone, N-vinyl caprolactame and N-vinyl imidazole or copolymer manufactured by 2-4 monomers selected from the above group. Formulas of acryl amide derivative, allylamine derivative and vinyl alcohol derivative are shown in following Formula 4a to Formula 4c.

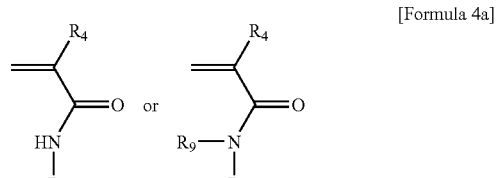

[Formula 4a]

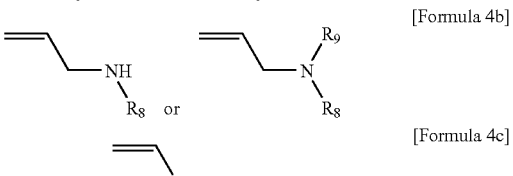

[Formula 4b]

[Formula 4c]

In Formula 4a to 4c, $R_4$ is hydrogen atom or methyl group ($CH_3$), $R_8$ and $R_9$ each is chain-or-ring-structured aromatic or aliphatic hydrocarbon of C1-C15, preferably C1-C10, containing hetero atom of 1-5, preferably nitrogen atom (N), oxygen atom (O) and sulfur atom(S) of 1-4. Examples thereof include tertiarybutyl, hydroxylmethyl, isoprophyl, phenyl, methyl, ethyl, prophyl, normalbutyl, isobutyl, cyclophentyl, cyclohexyl, isopentyl, isohexyl, normalhexyl, formate and acetate.

Examples of the binder polymer include polyacrylamide, polyvinylalcohol, polyvinylpyrrolidone and poly(vinylpyrrolidone-co-vinylimidazole).

If Mw of the binder polymer is less than 1,000, coating uniformity at the spin-coating can be degraded, and if Mw of the binder polymer is more than 100,000, the solubility and mixing with the cross-linker and the refractivity enhancer can be degraded. Amount of the binder polymer, in case where the mirror interlayer (21) is formed by coating the solution, is 200 to 2,000 weight part, preferably 500 to 1,000 weight part with respect to 100 weight part of the cross-linker. If the amount of the binder polymer is less than 200 weight part with respect to 100 weight part of the cross-linker, the coating uniformity in spin-coating can be lowered owing to the excess addition of the cross-linker. If the amount of the binder polymer is more than 2,000 weight part, the scattered reflection by the mirror interlayer may not be induced.

As a solvent of the present invention, conventional polar protic solvent can be used. For example, water, methanol, ethanol, isopropanol(IPA), propaneglycolmonomethylether, isoamylether, ethylactate, normal butanol, normal phentanol, normal hexanol, normal propanol, formamide, formic acid, acetic acid, 4-methyl-2-pentanol and mixture thereof can be used. Amount of the solvent, in case where the mirror interlayer (21) is formed by coating the solution, is for dissolving all amount of the composition for the mirror interlayer (mirror interlayer composition), i.e., the cross-linker, binder polymer etc. For example, the amount of the solvent is 100 to 7,000 weight part, preferably 500 to 6,000 weight part, more preferably 1,000 to 5000 weight part, with respect to 100 weight part of the binder polymer. If the amount of the solvent is less than 100 weight part with respect to 100 weight part of the binder polymer, the coated layer becomes thick so the polymer remains even after removing the binder polymer. If the amount of the solvent is more than 7,000 weight part with respect to 100 weight part of the binder polymer, the coated layer becomes thin so the coating uniformity can be lowered.

The composition for the mirror interlayer (21) according to the present invention further comprises a reflectivity enhancer. The reflectivity enhancer is added in order to endow the mirror interlayer (21) with a reflective index of 1.5-2.0 to a light having 193 nm wavelength. In this case, the reflectivity enhancer increases the reflective index of the mirror interlayer (21) while securing good transmittance to a light having 193 nm wavelength.

The reflectivity enhancer is selected from a group consisting of siloxane compound represented by following Formula 5 and isocyanurate compounds represented by following Formula 6, and the molecular weight thereof is 300 to 100,000, preferably 500 to 80,000.

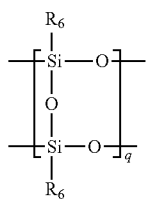

[Formula 5]

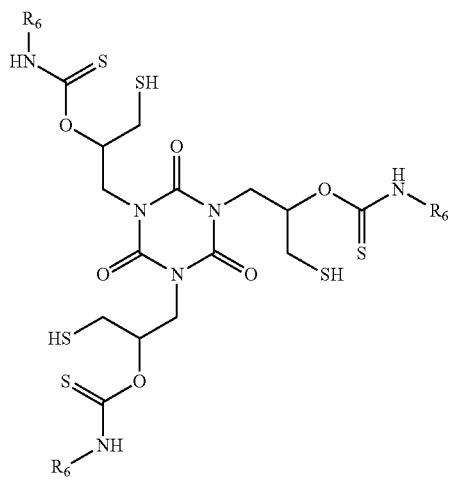

[Formula 6]

In Formula 5 and Formula 6, $R_6$ is chain-or-ring-structured aromatic or aliphatic hydrocarbon of C1-C19, preferably C1-C15, containing hetero atom of 0-21, preferably nitrogen atom (N), oxygen atom (O) and sulfur atom (S) of 0-15. q is an integer of 2 to 1000, preferably 4 to 800.

Examples of the reflectivity enhancer include

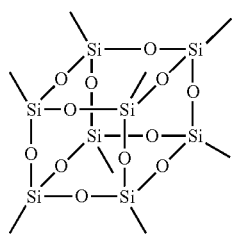

(in Formula 5, q is 4, $R_6$ is methyl group (—CH$_3$)),

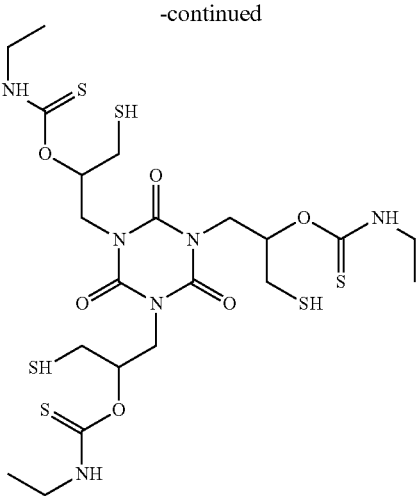

(in Formula 6, $R_6$ is ethyl group (—CH$_2$CH$_3$)).

The amount of the reflectivity enhancer, when used, is 1 to 50 weight part, preferably 5 to 20 weight part, with respect to 100 weight part of the binder polymer. The amount of the reflectivity enhancer is less than 1 weight part with respect to 100 weight part of the binder polymer, the reflective index of the mirror interlayer (21) is reduced so that formation of the second pattern resulted from the scattered reflection is hampered. If the amount of the reflectivity enhancer is more than 50 weight part with respect to 100 weight part of the binder polymer, the coating uniformity in spin-coating is reduced.

Figure 1:
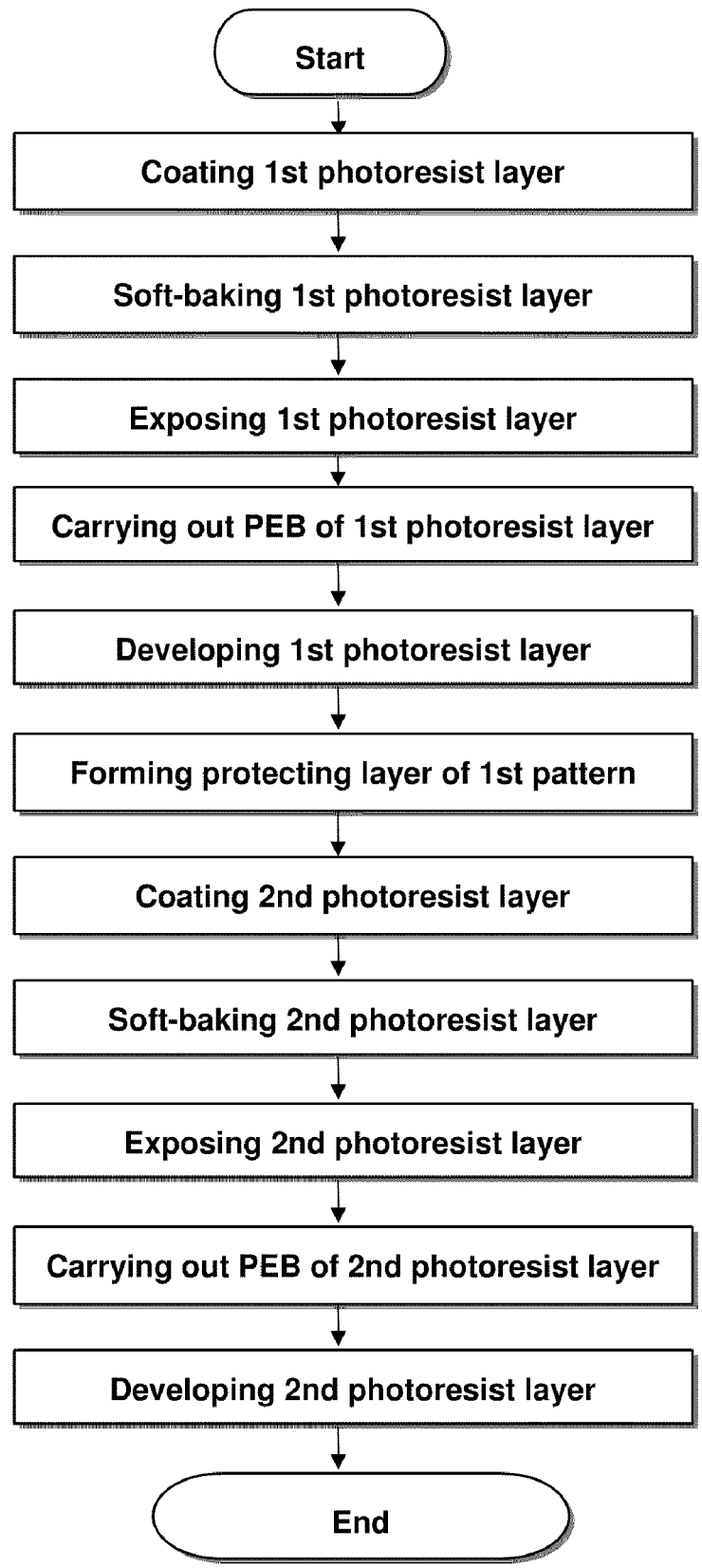
FIG. 1 is a flow chart showing steps for forming semiconductor patterns according to a conventional double expose patterning process.
Figure 2:
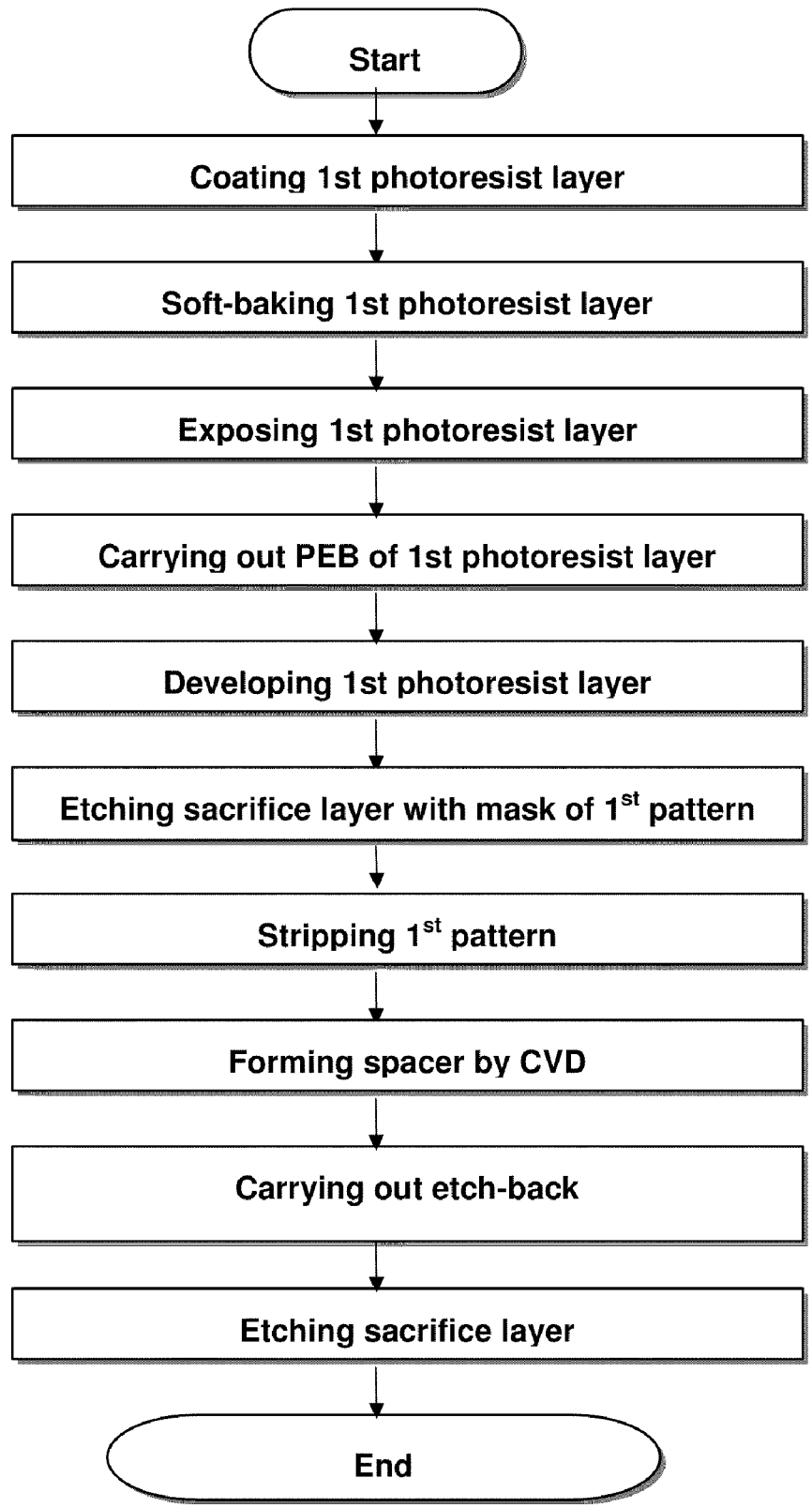
FIG. 2 is a flow chart showing steps for forming semiconductor patterns according to a conventional SPT.
Figure 3:
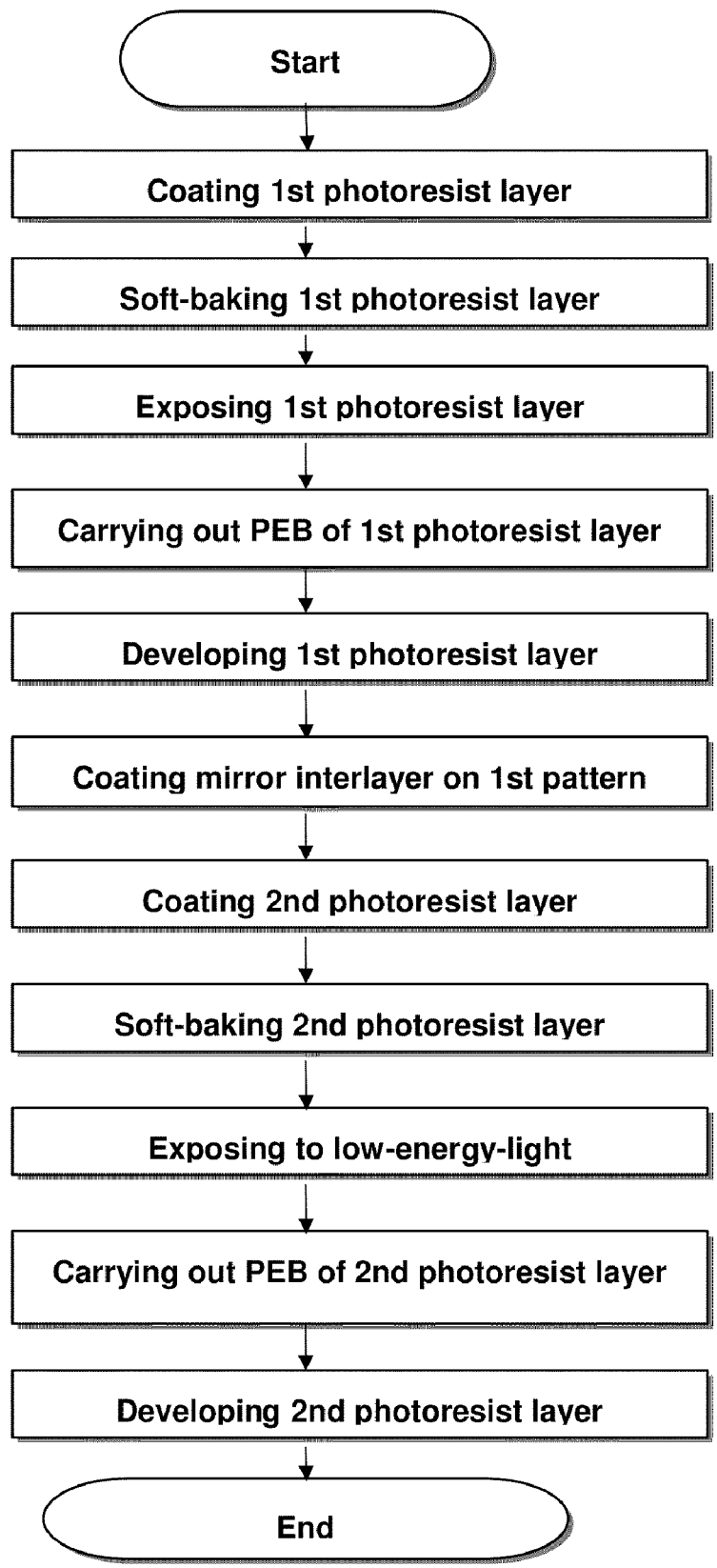
FIG. 3 is a flow chart showing steps for forming semiconductor patterns according to the present invention.

The first photoresist pattern (17) of the present invention is formed by using the conventional photoresist composition and photolithography process without special limitation. For example, a first photoresist layer composition is coated on a semiconductor substrate (11) on which an etching layer (13) is formed, to form the first photoresist layer and then the first photoresist layer is soft-baked. The first photoresist layer is exposed to a light having exposure energy (Eop) which enables the most optimum pattern by using an exposure mask with line and space patterns. The resultant is post-exposure baked (PEB) at temperature of 90 to 150° C. for 30 to 180 seconds. Then the PEB resultant is developed to form the first photoresist pattern (17) (See: FIG. 3).

The refractive index of the second photoresist layer (31) of the present invention to the light of low energy is smaller than the refractive index of the mirror interlayer (21) by 1-50%, preferably 5-10%. Thus, without the exposure mask, the second photoresist patterns (33) can be formed between the first photoresist patterns (17) by the scattered reflection of the mirror interlayer (21).

The first photoresist patterns (17) and the second photoresist patterns (33) are made of the conventional photoresist composition. Preferably the composition composing the first photoresist patterns (17) and the second photoresist patterns (33) includes photosensitive polymer (base polymer) represented by following Formula 7, photo acid generator (PAG) and organic solvent.

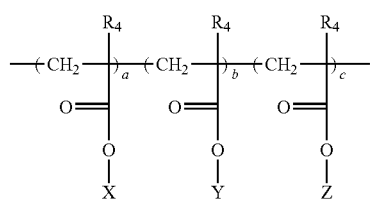

[Formula 7]

In Formula 7, $R_4$ is independently hydrogen atom or methyl group. X, Y and Z each is independently chain-or-ring-structured aromatic or aliphatic hydrocarbon of C1-C25 containing hetero atom of 0-20. Preferably X is chain-or-ring-structured aromatic or aliphatic hydrocarbon of C1-C20 containing oxygen atom (O) and nitrogen atom (N) of 0-10. Y is lactone group and chain-or-ring-structured aromatic or aliphatic hydrocarbon of C1-C20 containing oxygen atom (O) and nitrogen atom (N) of 0-10. Z is hydroxyl group or hydroxyl group-and-halogen group-substituted and chain-or-ring-structured aromatic or aliphatic hydrocarbon of C1-C20 containing oxygen atom (O), nitrogen atom (N) of 0-10. a, b and c each represents mol % of the repeating unit with respect to total monomers composing the polymer. a is 10 to 75 mol %, preferably 15 to 55 mol %, b is 15 to 80 mol %, preferably 30 to 70 mol %, and c is 10 to 75 mol %, preferably 15 to 55 mol %, more preferably 20 to 35 mol %. If the mol % of the repeating unit deviates the above-mentioned range, physical property of the photoresist layer is degraded, it is difficult to form the photoresist layer and contrast of the patterns is degraded. Conventionally the weight-average molecular weight (Mw) of the photosensitive polymer is 3,000 to 20,000, preferably 3,000 to 12,000.

Detailed examples of X include

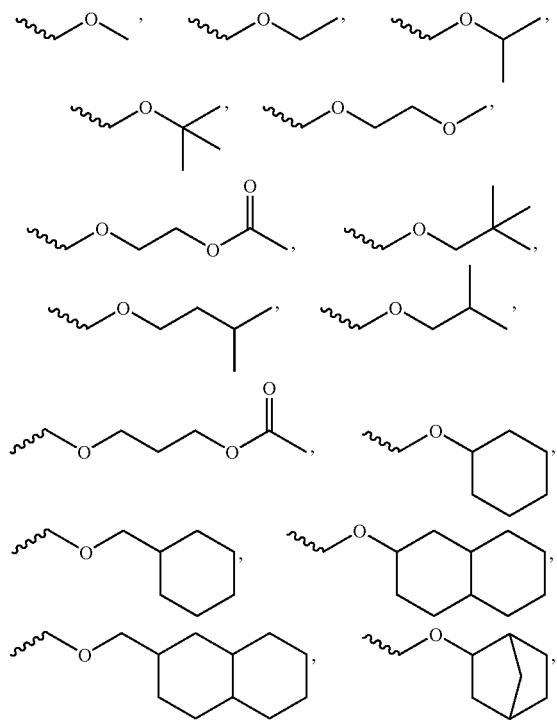

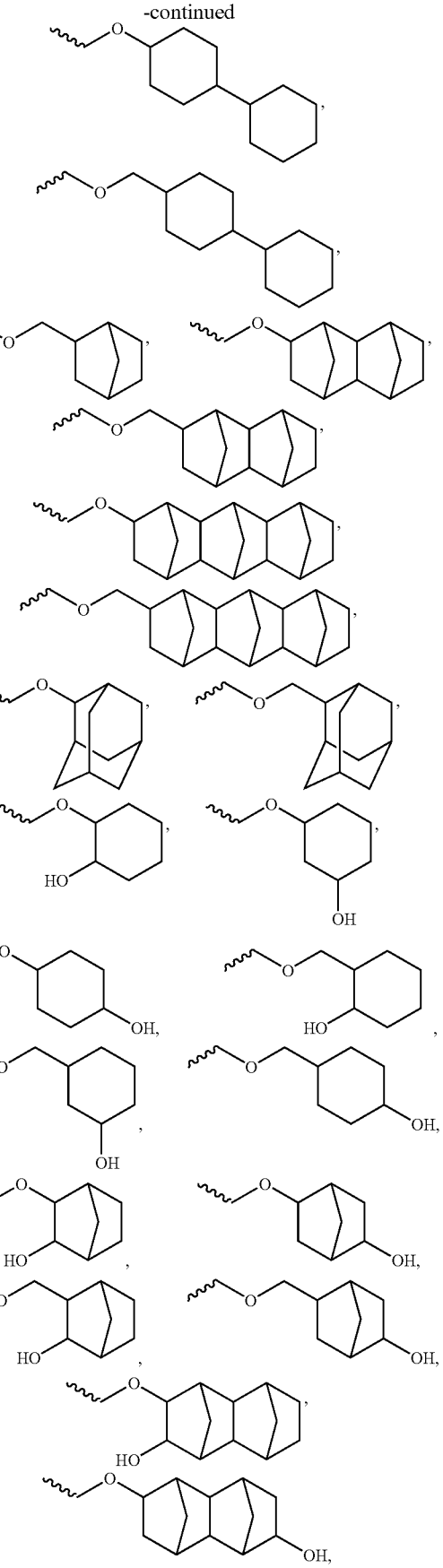

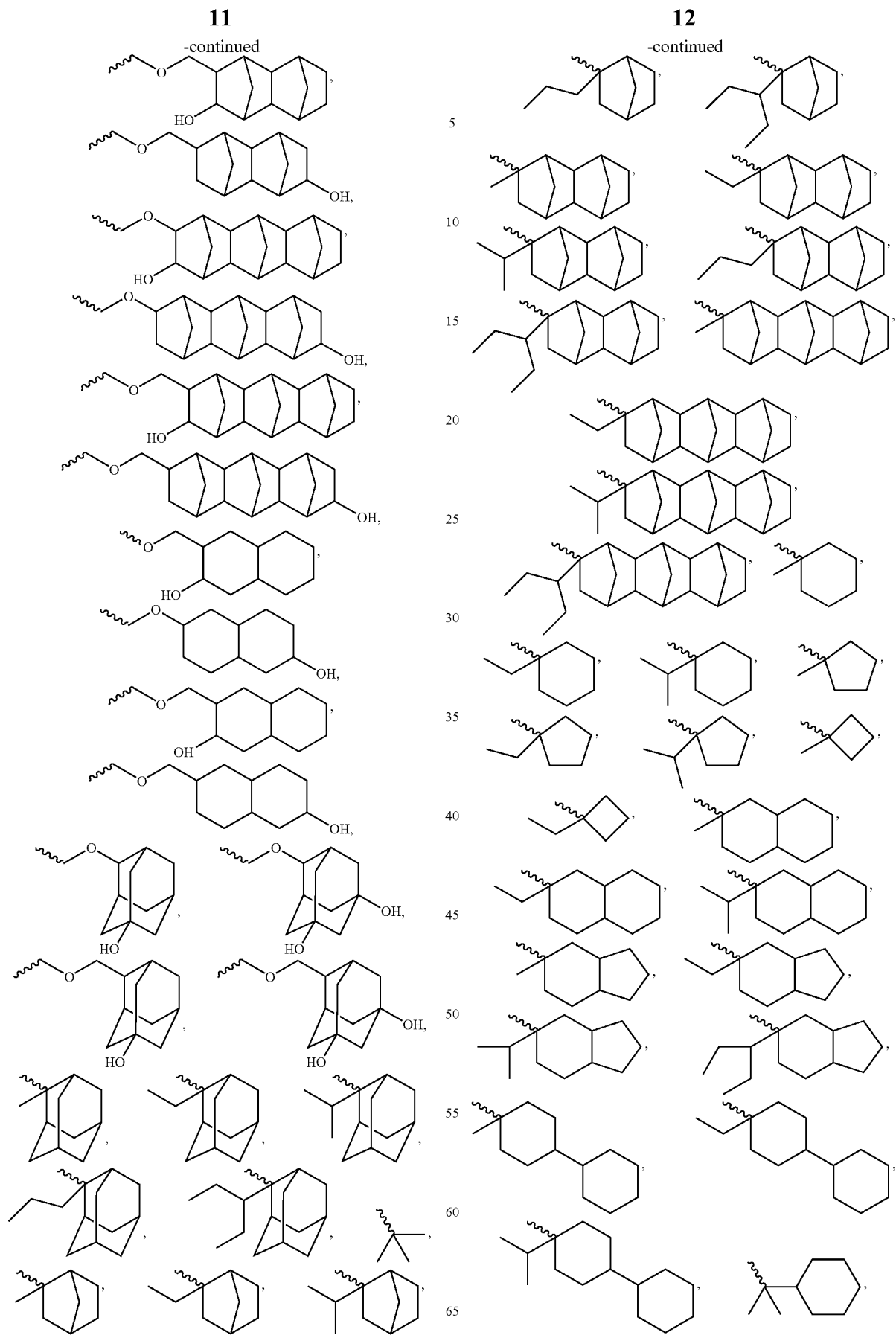

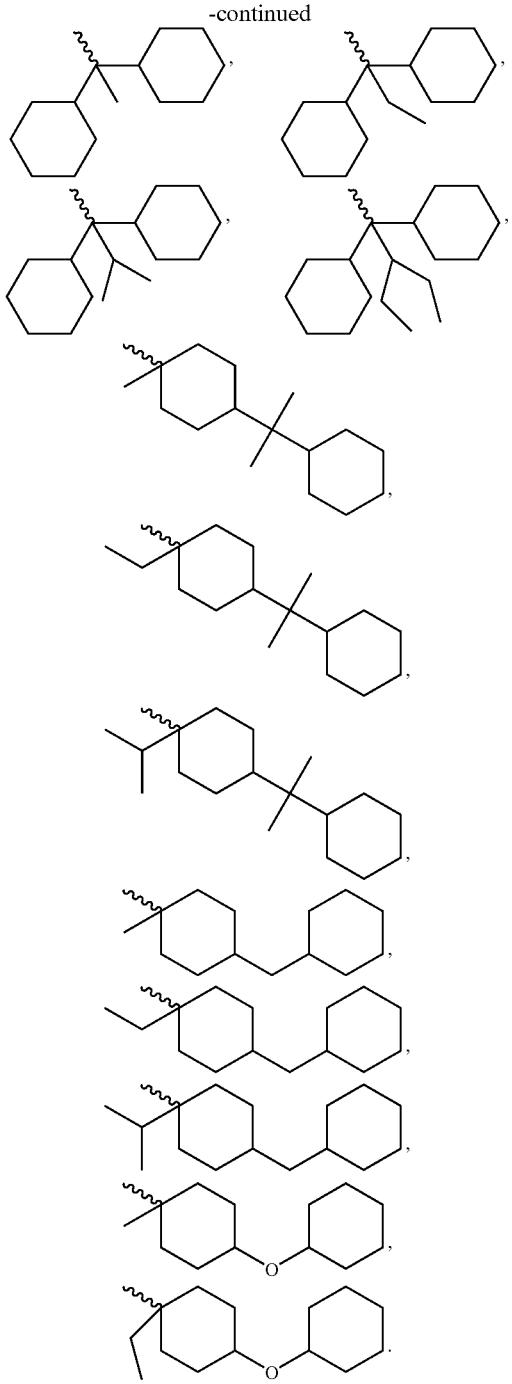
Detailed examples of Y include
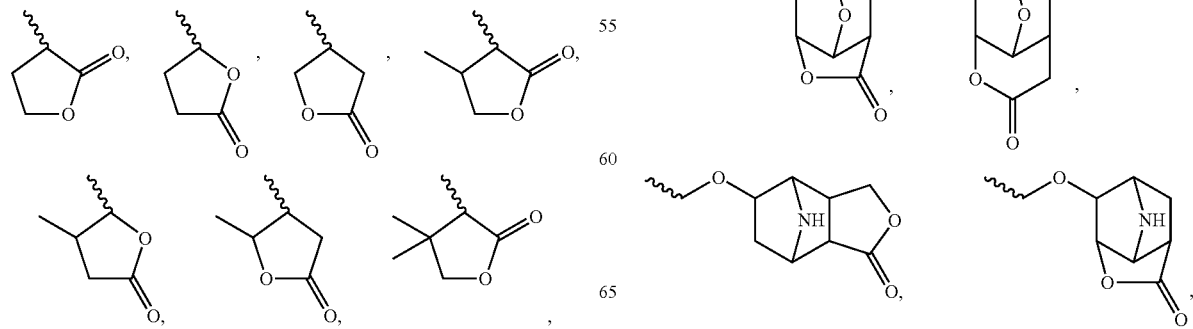
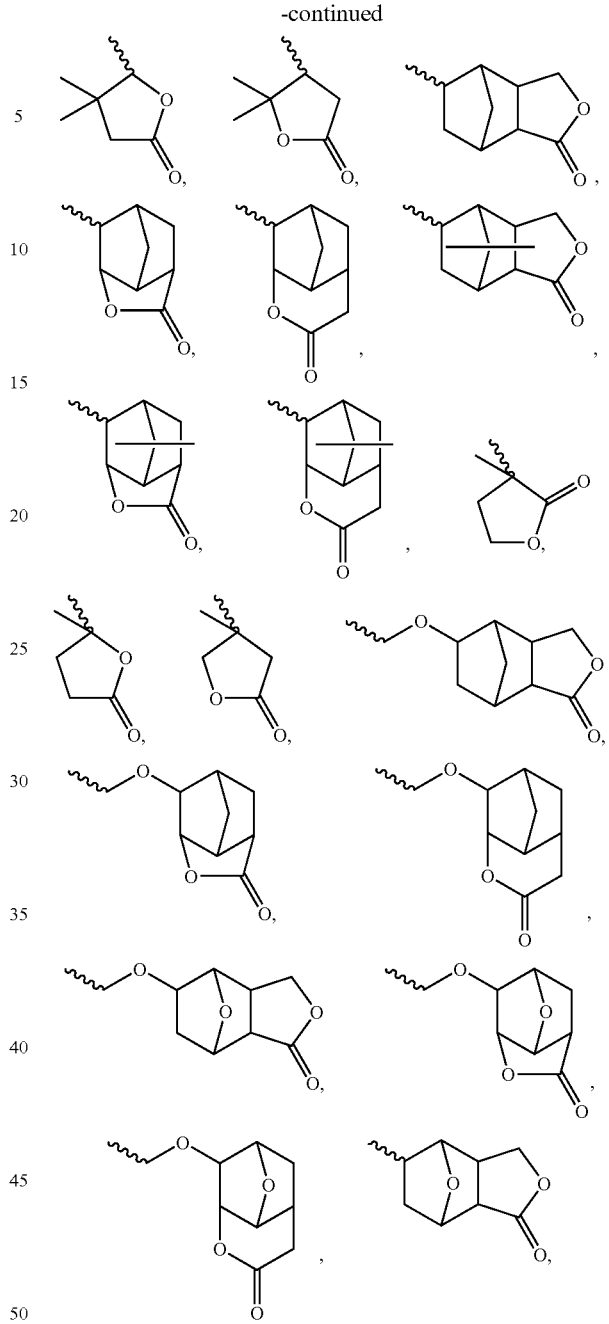

-continued
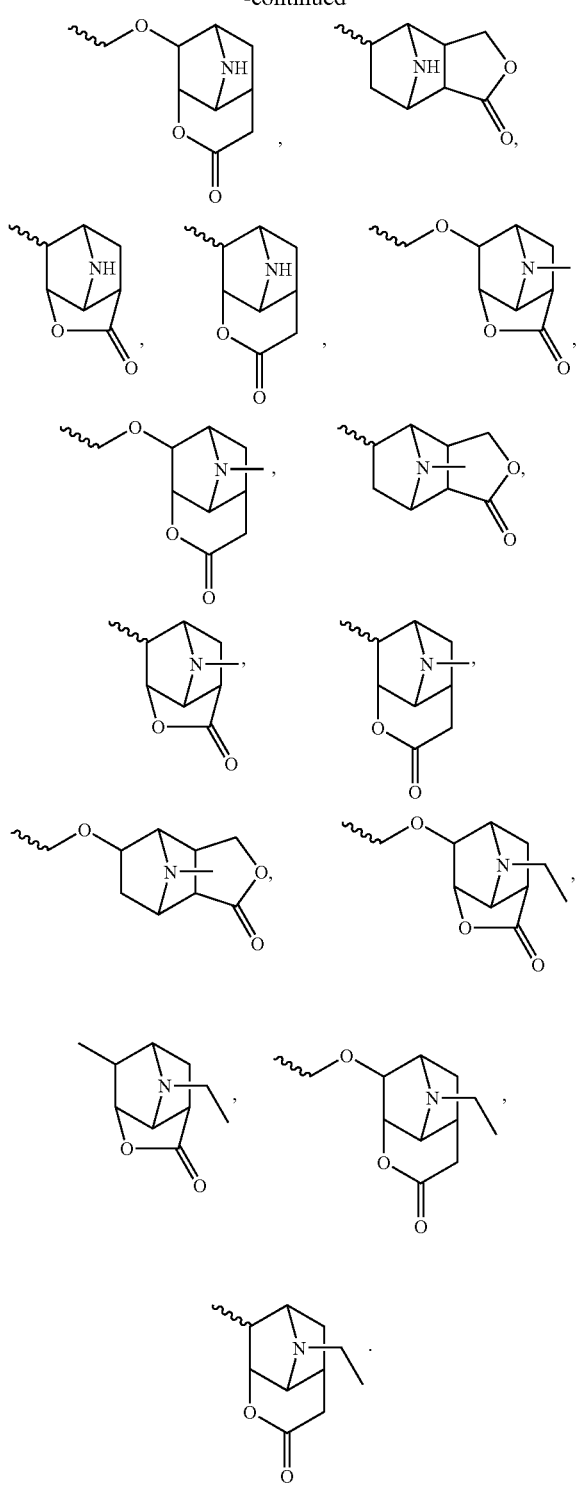
The detailed example of Z include
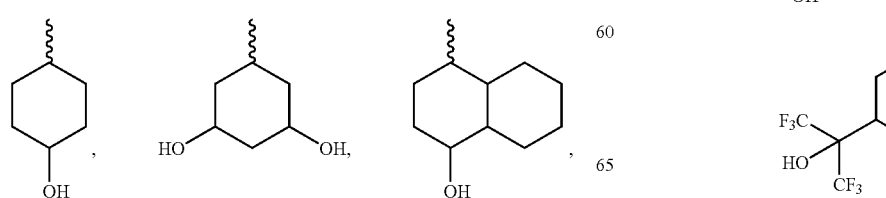
-continued
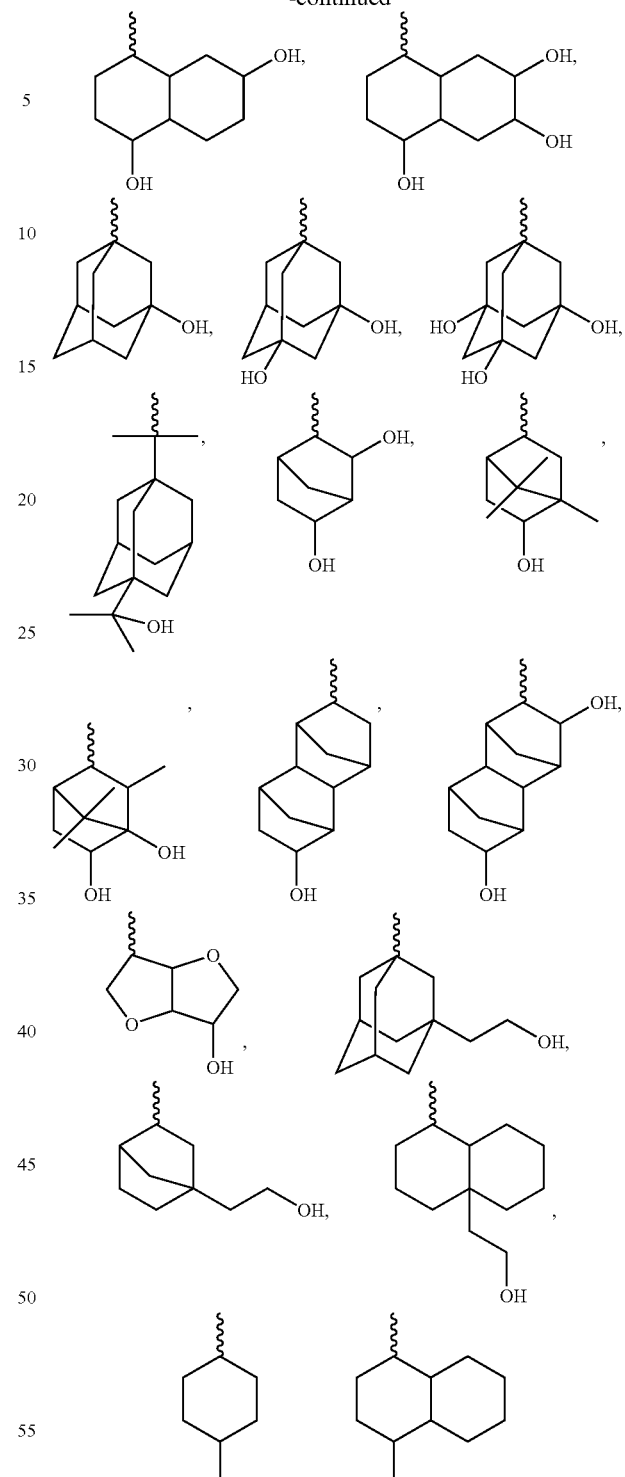
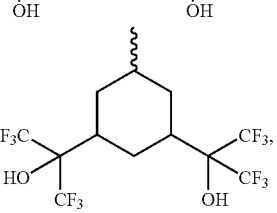

-continued

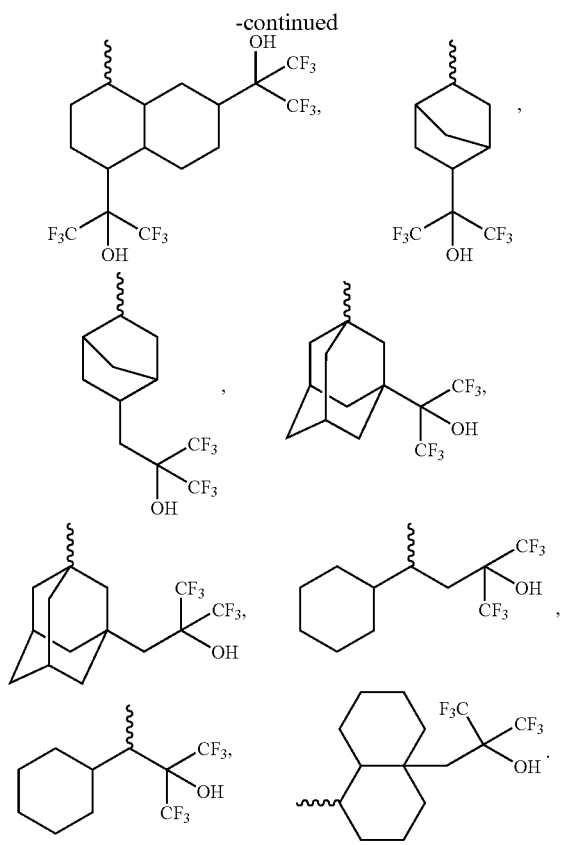

As the PAG (photo acid generator), any compound, which can generate an acid component when exposed to light, can be used. The non-limiting examples of the PAG include sulfonium salt based compound or onium salt based compound. Preferably one selected from a group consisting of phthalimidotrifluoro methane sulfonate, dinitrobenzyltosylate, n-decyldisulfone and naphthyl imidotrifluoromethane sulfonate, can be used. Also, the PAG is selected from the group consisting of diphenyl iodonium triflate, diphenyl iodonium nonaflate, diphenyl iodonium hexafluorophosphate, diphenyl iodonium hexafluoroarsenate, diphenyl iodonium hexafluoroantimonate, diphenyl p-methoxyphenyl sulfonium triflate, diphenyl p-toluenyl sulfonium triflate, diphenyl p-tert-butylphenyl sulfonium triflate, diphenyl p-isobutylphenyl sulfonium triflate, triphenylsulfonium triflate, tris(p-tert-butylphenyl) sulfonium triflate, diphenyl p-methoxyphenyl sulfonium nonaflate, diphenyl p-toluenyl sulfonium nonaflate, diphenyl p-tert-butylphenyl sulfonium nonaflate, diphenyl p-isobutylphenyl sulfonium nonaflate, triphenylsulfonium nonaflate, tris(p-tert-butylphenyl) sulfonium nonaflate, triphenylsulfonium hexafluoroarsenate, triphenylsulfonium hexafluoroantimonate, triphenylsulfonium triflate and dibutylnaphtylsulfonium triflate. The preferable amount of the PAG is 0.05 to 10 weight part, preferably 0.1 to 8 weight part with respect to 100 weight part of photoresist polymer. If an amount of the PAG is less than 0.05 weight part, the sensitivity of the photoresist composition against light decreases. If the amount of the PAG is more than 10 weight part the profile of the resist patterns may be deteriorated because the PAG absorbs a lot of ultraviolet rays and a large quantity of acid is produced from the PAG.

As the organic solvent, the conventional various organic solvents for the photoresist composition can be used. For example, the organic solvent is one selected from a group consisting of ethyleneglycol monomethylethyl, ethyleneglycol monoethylether, ethyleneglycol monomethylether, ethyleneglycol monoacetate, diethylene glycol, diethyleneglycol monoethylether, propyleneglycol monomethyletheracetate (PGMEA), propyleneglycol, propyleneglycol monoacetate, toluene, xylene, methylethylketone, methyl isoamyl ketone, cyclohexanone, dioxane, methyl lactate, ethyl lactate, methyl pyruvate, ethyl pyruvate, methyl methoxy propionate, ethyl ethoxy propionate, N,N-dimethylformamide, N,N-dimethylacetamide, N-methyl-2-pyrollidone, 3-ethoxy ethyl propionate, 2-heptanone, gamma-butyrolactone, ethyl 2-hydroxy propionate, ethyl 2-hydroxy-2-methyl propionate, ethoxyethyl acetate, hydroxylethyl acetate, methyl 2-hydroxy-3-methylbutanoate, methyl 3-methoxy-2-methylpropionate, ethyl 3-ethoxy propionate, ethyl 3-methoxy-2-methyl propionate, ethyl acetate, butyl acetate, and mixture thereof (mixture of 2~4 organic solvents). The amount of the organic solvent is 100 to 10,000 weight part, preferably 1,000 to 7,000 weight part with respect to 100 weight part of the photoresist polymer. The amounts of the organic solvent deviate from the above mentioned range, the physical property of the photoresist film is degraded, the formation of photoresist film is difficult and contrast of the photoresist patterns is deteriorated.

The photoresist composition of the present invention further comprises a base compound for regulating acid-diffusion (organic base or organic quencher). As the base compound, the conventional quenchers or reaction inhibitors, for example organic bases such as tri-ethylamine, trioctylamine, tri-iso-butylamine, tri-iso-octylamine, di-ethanolamine, tri-ethanolamine and mixture thereof, can be used without limitation. Specifically, base quencher represented by following Formula 8 can be used as the base compound.

[Formula 8]

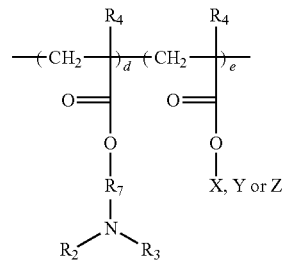

In Formula 8, $R_2$, $R_3$ and $R_4$ are the same as defined in Formula 3 and Formula 4. X, Y and Z are the same as defined in Formula 7. $R_7$ is chain-or-ring-structured aromatic or aliphatic hydrocarbon of C1-C20, preferably C2-C15, containing hetero atom of 1-10, preferably nitrogen atom (N), oxygen atom (O) and sulfur atom (S) of 1-8. d and e each is mol % of repeating unit with respect to total monomers constituting the polymer. d is 0.1 to 25 mol %, preferably 0.5 to 20 mol % and e is 75 to 99.9 mol %, preferably 80 to 99.5 mol %.

The weight-average molecular weight (Mw) of the base quencher is 2,000 to 20,000, preferably 2,500 to 15,000, and polydispersity index (PDI) thereof is 1.0 to 2.0, preferably 1.2 to 1.8. The Mw and PDI are out of the above mentioned range, the solubility to the solvent is reduced and the pattern contrast is degraded.

If the base quencher is used, the amount of the base quencher is 0.01 to 5 weight part, preferably 0.05 to 4 weight part, with respect to 100 weight part of the photoresist polymer. The used amount deviates the above range, a lot of acid are produced so that the pattern profile is bad and the pattern contrast is degraded.

The second photoresist pattern (33) of the present invention is manufactured by the method (see FIG. 3) comprising the steps of coating composition for the second photoresist on a resultant on which the first photoresist pattern (17) and a mirror interlayer (21) are successively formed, to form the second photoresist layer (31) and then carrying out a soft-baking; exposing the second photoresist layer (31) without an exposure mask, to a light having energy lower than a threshold energy (Eth) of the second photoresist layer (31); post-exposure-baking the resultant at 90 to 150° C. for 30 to 180 seconds; and developing the resultant to form the second photoresist pattern (33).

Hereinafter, the preferable examples are provided for better understanding of the present invention. However, the present invention is not limited by the following examples.

Examples 1 to 53 and Comparative Examples 1 to 3

Formation of Fine Patterns of the Semiconductor Device and Evaluation Thereof

Formation of the First Photoresist Patterns

After stirring the first photoresist composition of following Table 3 at room temperature for 4 hours and then filtering the same, the filtered composition was coated on a wafer and then soft-baked at 110° C. for 60 seconds. After soft-baking, the resultant was exposed by using an exposure mask having line and space(L/S) pattern and 193 nm ArF exposure instrument (ASML 1200B) and then post-exposure-baked at 110° C. for 60 seconds. After post-exposure-basking, the resultant was developed with 2.38 wt % TMAH (tetramethylammonium hydroxide) aqueous solution to get the first photoresist patterns having 50 nm L/S and 1:3 pitch.

Formation of the Mirror Interlayer

In Examples 1 to 50, after stirring a mirror interlayer composition according to following Table 1 at room temperature for 4 hours and filtering the same, the mirror interlayer composition filtered was coated on the first photoresist patterns by spin-coating method. Then the mirror interlayer composition was subject to mixing-bake at 110° C., development with third DI-water, heating at 160° C. more, thereby forming a mirror interlayer of 2 nm thickness on the first photoresist patterns. In Examples 51 to 53, a mirror interlayer composition (cross-linker) according to following Table 2 was vaporized by vaporization reaction. The wafer on which the first photoresist patterns are formed was introduced in a reactor. The mirror interlayer composition vaporized was injected to the reactor with 3 Liter/min(L/Min) and heated at 160° C. more. Thus, the mirror interlayer of 4 nm was formed on the first photoresist patterns. In Comparative Examples 1 to 3, the mirror interlayer was not formed.

Formation of the Second Photoresist Patterns

A composition for the second photoresist layer (second photoresist composition) according to following Table 3 was stirred at room temperature for 4 hours and filtered. The second photoresist composition filtered was coated on the resultant on which the mirror interlayer was formed and soft-baked at 110° C. for 60 seconds. After soft-baking, the resultant was exposed to light having 193 nm by using ASML 1200B instrument and then post-exposure-baked at 110° C. for 60 seconds. After post-exposure-basking, the resultant was developed with 2.38 wt % TMAH (tetramethylammonium hydroxide) aqueous solution to get the second photoresist patterns having 50 nm L/S and 1:3 pitch.

Figure 6:
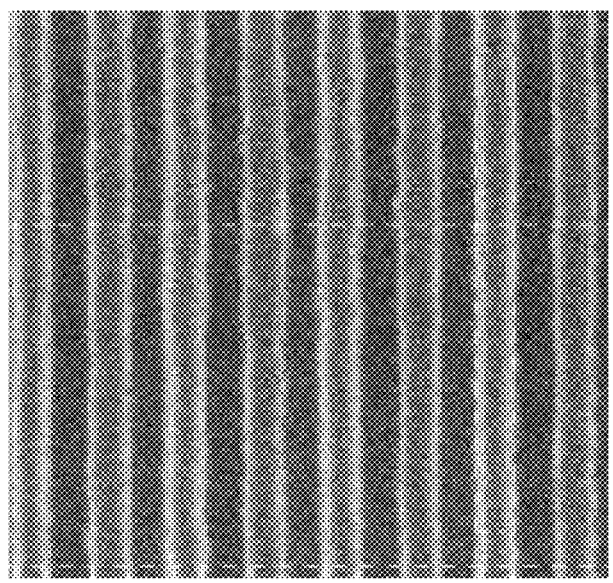
FIG. 6 is a drawing for showing SEM (Scanning Electron Microscope) photography of fine pattern (50 nm) manufactured at Example 10 according to a present invention.

In the fine patterns of the semiconductor device manufactured in the Examples, the refractive index (n), line width of the patterns (critical dimension: CD), line width difference of the first photoresist patterns and the second photoresist patterns (ΔCD), profile of the second photoresist patterns and resolution were measured by using CD-SEM (Hitachi-S9220), FE-SEM (Hitachi-S4300) and Elipsometer (J.A. Woollam-WVASE32) instruments. The results thereof are shown in following Table 4. Also, to show the effect of the mirror interlayer, drawing for illustrating SEM photography of fine pattern (50 nm) manufactured at Example 10 according to present invention is shown in FIG. 6.

TABLE 1

| Example | Binder polymer 14 g | Cross-linker 1.4 g | Refractivity enhancer 0.7 g | Solvent 263.9 g |
|---|---|---|---|---|
| 1 | Polyacrylamide | Ethylenediamine | POSS | Water:IPA = 80:20 |
| 2 | Polyacrylamide | Ethylenediamine | POSS | Water:IPA = 80:20 |
| 3 | Polyacrylamide | Ethylenediamine | POSS | Water:IPA = 80:20 |
| 4 | Polyacrylamide | Triethylenetetramine | POSS | Water:IPA = 80:20 |
| 5 | Polyacrylamide | Triethyleneglycol | POSS | Water:IPA = 80:20 |
| 6 | Polyacrylamide | Ethylenediamine | ICN | Water:IPA = 80:20 |
| 7 | Polyacrylamide | Triethylenetetramine | ICN | Water:IPA = 80:20 |
| 8 | Polyacrylamide | Triethyleneglycol | ICN | Water:IPA = 80:20 |
| 9 | Polyvinylalcohol | Ethylenediamine | POSS | Water:IPA = 80:20 |
| 10 | Polyvinylalcohol | Triethylenetetramine | POSS | Water:IPA = 80:20 |
| 11 | Polyvinylalcohol | Triethyleneglycol | POSS | Water:IPA = 80:20 |
| 12 | Polyvinylalcohol | Ethylenediamine | ICN | Water:IPA = 80:20 |
| 13 | Polyvinylalcohol | Triethylenetetramine | ICN | Water:IPA = 80:20 |
| 14 | Polyvinylalcohol | Triethyleneglycol | ICN | Water:IPA = 80:20 |
| 15 | Polyvinylpyrrolidone | Ethylenediamine | POSS | Water:IPA = 80:20 |
| 16 | Polyvinylpyrrolidone | Triethylenetetramine | POSS | Water:IPA = 80:20 |
| 17 | Polyvinylpyrrolidone | Triethyleneglycol | POSS | Water:IPA = 80:20 |
| 18 | Polyvinylpyrrolidone | Ethylenediamine | ICN | Water:IPA = 80:20 |
| 19 | Polyvinylpyrrolidone | Triethylenetetramine | ICN | Water:IPA = 80:20 |
| 20 | Polyvinylpyrrolidone | Triethyleneglycol | ICN | Water:IPA = 80:20 |
| 21 | Poly(vinylpyrrolidone-co-vinylimidazole) | Ethylenediamine | POSS | Water:IPA = 80:20 |
| 22 | Poly(vinylpyrrolidone-co-vinylimidazole) | Triethylenetetramine | POSS | Water:IPA = 80:20 |
| 23 | Poly(vinylpyrrolidone-co-vinylimidazole) | Triethyleneglycol | POSS | Water:IPA = 80:20 |

TABLE 1-continued

| Example | Binder polymer 14 g | Cross-linker 1.4 g | Refractivity enhancer 0.7 g | Solvent 263.9 g |
|---|---|---|---|---|
| 24 | Poly(vinylpyrrolidone-co-vinylimidazole) | Ethylenediamine | ICN | Water:IPA = 80:20 |
| 25 | Poly(vinylpyrrolidone-co-vinylimidazole) | Triethylenetetramine | ICN | Water:IPA = 80:20 |
| 26 | Poly(vinylpyrrolidone-co-vinylimidazole) | Triethyleneglycol | ICN | Water:IPA = 80:20 |
| 27 | Polyacrylamide | Ethylenediamine | POSS | 4-methyl-2-pentanol |
| 28 | Polyacrylamide | Ethylenediamine | ICN | 4-methyl-2-pentanol |
| 29 | Polyvinylalcohol | Ethylenediamine | POSS | 4-methyl-2-pentanol |
| 30 | Polyvinylalcohol | Ethylenediamine | ICN | 4-methyl-2-pentanol |
| 31 | Polyvinylpyrrolidone | Ethylenediamine | POSS | 4-methyl-2-pentanol |
| 32 | Polyvinylpyrrolidone | Ethylenediamine | ICN | 4-methyl-2-pentanol |
| 33 | Poly(vinylpyrrolidone-co-vinylimidazole) | Ethylenediamine | POSS | 4-methyl-2-pentanol |
| 34 | Poly(vinylpyrrolidone-co-vinylimidazole) | Ethylenediamine | ICN | 4-methyl-2-pentanol |
| 35 | Polyacrylamide | Ethylenediamine | POSS | Isoamylether |
| 36 | Polyacrylamide | Ethylenediamine | ICN | Isoamylether |
| 37 | Polyvinylalcohol | Ethylenediamine | POSS | Isoamylether |
| 38 | Polyvinylalcohol | Ethylenediamine | ICN | Isoamylether |
| 39 | Polyvinylpyrrolidone | Ethylenediamine | POSS | Isoamylether |
| 40 | Polyvinylpyrrolidone | Ethylenediamine | ICN | Isoamylether |
| 41 | Poly(vinylpyrrolidone-co-vinylimidazole) | Ethylenediamine | POSS | Isoamylether |
| 42 | Poly(vinylpyrrolidone-co-vinylimidazole) | Ethylenediamine | ICN | Isoamylether |
| 43 | Polyacrylamide | Ethylenediamine | — | Water:IPA = 80:20 |
| 44 | Polyacrylamide | Ethylenediamine | — | Water:IPA = 80:20 |
| 45 | Polyvinylalcohol | Ethylenediamine | — | Water:IPA = 80:20 |
| 46 | Polyvinylalcohol | Ethylenediamine | — | Water:IPA = 80:20 |
| 47 | Polyvinylpyrrolidone | Ethylenediamine | — | Water:IPA = 80:20 |
| 48 | Polyvinylpyrrolidone | Ethylenediamine | — | Water:IPA = 80:20 |
| 49 | Poly(vinylpyrrolidone-co-vinylimidazole) | Ethylenediamine | — | Water:IPA = 80:20 |
| 50 | Poly(vinylpyrrolidone-co-vinylimidazole) | Ethylenediamine | — | Water:IPA = 80:20 |

(POSS:

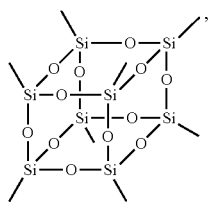

ICN:

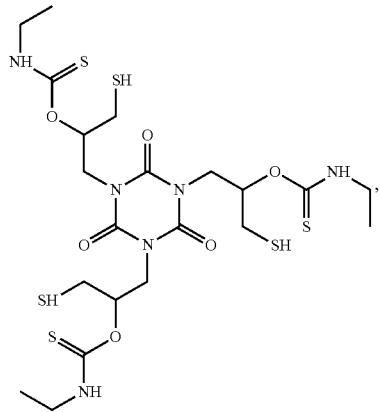

,

IPA: isopropanol)

TABLE 2

| Example | Cross-linker | Injection speed (L/min) |
|---|---|---|
| 51 | Ehtylenediamine | 3 L/min |
| 52 | Diethylenediamine | 3 L/min |
| 53 | Triethylenetetramine | 3 L/min |

TABLE 3

| | | Photoresist polymer | PAG | Base quencher | Organic solvent |
|---|---|---|---|---|---|
| Examples 1, 4-53 Comparative Example 1 | First photoresist composition Second photoresist composition | A-1-1, 5 g | Triphenyl sulfonium nonaflate 0.2 g | Trioctyl-amine 0.02 g | PGMEA 100 g |
| Example 2, Comparative Example 2 | First photoresist composition Second photoresist composition | A-1-2, 5 g | Triphenyl sulfonium nonaflate 0.2 g | Trioctyl-amine 0.02 g | PGMEA 100 g |
| Example 3, Comparative Example 3 | First photoresist composition Second photoresist composition | A-1-3, 5 g | Triphenyl sulfonium nonaflate 0.2 g | Trioctyl-amine 0.02 g | PGMEA 100 g |

(A-1-1:

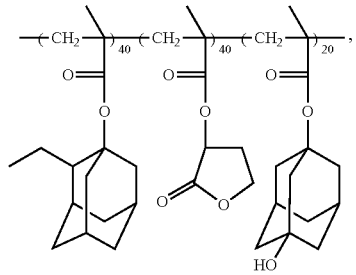

Mw = 3,000 to 12,000))

(A-1-2:

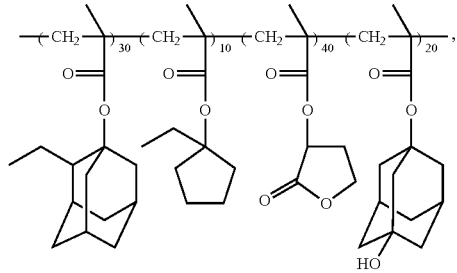

Mw = 3,000 to 12,000))

(A-1-3:

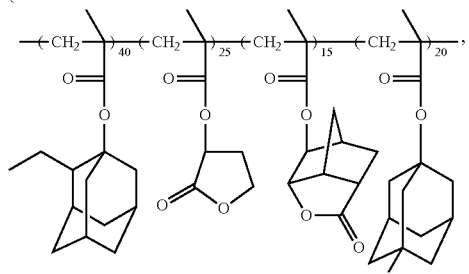

Mw = 3,000 to 12,000))

TABLE 4

| | Resolution 4 | ΔCD (first CD − second CD) | Refractive index (n) | Effect of mirror interlayer Profile of second pattern |
|---|---|---|---|---|
| Comparative Example 1 | <50 nm | — | 1.688 | — |
| Comparative Example 2 | <50 nm | — | 1.695 | — |
| Comparative Example 3 | <50 nm | — | 1.690 | — |
| Example 1 | <50 nm | 3.2 nm | 1.755 | Vertical |
| Example 2 | <50 nm | 3.2 nm | 1.749 | Vertical |
| Example 3 | <50 nm | 3.2 nm | 1.745 | Vertical |
| Example 4 | <50 nm | 3.3 nm | 1.745 | Vertical |
| Example 5 | <50 nm | 3.6 nm | 1.753 | Vertical |
| Example 6 | <50 nm | 3.5 nm | 1.780 | Vertical |
| Example 7 | <50 nm | 3.6 nm | 1.754 | Vertical |
| Example 8 | <50 nm | 3.9 nm | 1.780 | Vertical |
| Example 9 | <50 nm | 2.6 nm | 1.767 | Vertical |
| Example 10 | <50 nm | 3.0 nm | 1.749 | Vertical |
| Example 11 | <50 nm | 2.8 nm | 1.755 | Vertical |
| Example 12 | <50 nm | 2.3 nm | 1.756 | Vertical |
| Example 13 | <50 nm | 2.5 nm | 1.785 | Vertical |
| Example 14 | <50 nm | 2.4 nm | 1.789 | Vertical |
| Example 15 | <50 nm | 1.3 nm | 1.792 | Vertical |
| Example 16 | <50 nm | 1.5 nm | 1.778 | Vertical |
| Example 17 | <50 nm | 1.7 nm | 1.769 | Vertical |
| Example 18 | <50 nm | 1.2 nm | 1.801 | Vertical |
| Example 19 | <50 nm | 1.6 nm | 1.736 | Vertical |
| Example 20 | <50 nm | 1.5 nm | 1.759 | Vertical |
| Example 21 | <50 nm | 2.0 nm | 1.767 | Vertical |
| Example 22 | <50 nm | 1.8 nm | 1.774 | Vertical |
| Example 23 | <50 nm | 1.9 nm | 1.782 | Vertical |
| Example 24 | <50 nm | 2.5 nm | 1.780 | Vertical |
| Example 25 | <50 nm | 2.1 nm | 1.820 | Vertical |
| Example 26 | <50 nm | 2.6 nm | 1.826 | Vertical |
| Example 27 | <50 nm | 2.4 nm | 1.772 | Vertical |
| Example 28 | <50 nm | 2.7 nm | 1.830 | Vertical |
| Example 29 | <50 nm | 3.1 nm | 1.759 | Vertical |
| Example 30 | <50 nm | 2.1 nm | 1.800 | Vertical |
| Example 31 | <50 nm | 3.1 nm | 1.761 | Vertical |
| Example 32 | <50 nm | 3.0 nm | 1.767 | Vertical |
| Example 33 | <50 nm | 1.9 nm | 1.768 | Vertical |
| Example 34 | <50 nm | 1.7 nm | 1.788 | Vertical |
| Example 35 | <50 nm | 2.1 nm | 1.777 | Vertical |
| Example 36 | <50 nm | 1.5 nm | 1.832 | Vertical |
| Example 37 | <50 nm | 2.4 nm | 1.750 | Vertical |
| Example 38 | <50 nm | 2.5 nm | 1.801 | Vertical |
| Example 39 | <50 nm | 2.0 nm | 1.730 | Vertical |
| Example 40 | <50 nm | 1.7 nm | 1.800 | Vertical |
| Example 41 | <50 nm | 1.8 nm | 1.778 | Vertical |
| Example 42 | <50 nm | 3.9 nm | 1.820 | Vertical |
| Example 43 | <50 nm | 2.1 nm | 1.738 | slope |
| Example 44 | <50 nm | 1.5 nm | 1.730 | slope |
| Example 45 | <50 nm | 2.4 nm | 1.741 | slope |
| Example 46 | <50 nm | 2.5 nm | 1.729 | slope |
| Example 47 | <50 nm | 2.0 nm | 1.731 | slope |
| Example 48 | <50 nm | 1.7 nm | 1.745 | slope |
| Example 49 | <50 nm | 1.8 nm | 1.736 | slope |
| Example 50 | <50 nm | 3.9 nm | 1.737 | slope |
| Example 51 | <50 nm | 2.5 nm | 1.742 | slope |
| Example 52 | <50 nm | 3.4 nm | 1.734 | slope |
| Example 53 | <50 nm | 3.9 nm | 1.723 | slope |

Though same photoresist composition is used for forming the photoresist layer, the refractive index of the photoresist layer having a mirror interlayer according to Examples 1, 4-53 is 1.723 to 1.832 and the refractive index of the photoresist layer without a mirror interlayer according to Comparative Example 1 is 1.6888. Thus the refractive index of the photoresist layer having the mirror interlayer is larger than that of photoresist layer without the mirror interlayer. The profile of the second photoresist pattern (second pattern) is slope or vertical according to the change of the refractive index.

What is claimed is:

1. A method for forming fine patterns of semiconductor device, comprising the steps of:
   forming first photoresist patterns on a semiconductor substrate on which a layer to be etched is formed;
   coating the first photoresist patterns with a mirror interlayer;
   forming a photoresist layer on a resultant structure; and
   exposing the photoresist layer to a light having energy that is lower than a threshold energy (Eth) of the photoresist layer without an exposure mask, thereby allowing scattered reflections of the mirror-interlayer to form second photoresist patterns between the first photoresist patterns.

2. The method for forming fine patterns of semiconductor device as claimed in claim 1, wherein a composition for the mirror interlayer selectively comprises, in responsive to a coating method thereof, only cross-linker or a mixture of cross-linker, polymer binder and solvent, and the refractive index of the mirror interlayer to the light having energy which is lower than a threshold energy ($E_{th}$) of the photoresist layer is larger than the refractive index of the photoresist layer by 1-50%.

3. The method for forming fine patterns of semiconductor device as claimed in claim 2, wherein the cross-linker is selected from a group consisting of amine type compound represented by following Formula 1, alcohol type compound represented by following Formula 2, amide type compound represented by following Formula 3 and mixture thereof,

[Formula 1]

[Formula 2]

[Formula 3]
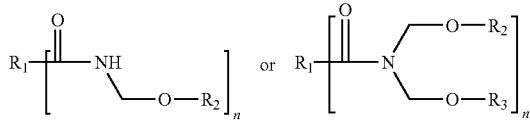

in Formula 1 to Formula 3, $R_1$ is chain-or-ring-structured aromatic or aliphatic hydrocarbon of C1-C10, containing hetero atom of 0-5, $R_2$ and $R_3$ are independently chain-or-ring-structured aromatic or aliphatic hydrocarbon of C1-C15, containing hetero atom of 0-5, and n is an integer of 1 to 6.

4. The method for forming fine patterns of semiconductor device as claimed in claim 2, wherein the binder polymer is a polymer containing repeating unit represented following Formula 4 and weight-average molecular weight thereof is 1,000 to 100,000,

[Formula 4]
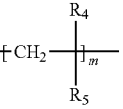

in Formula 4, $R_4$ is hydrogen atom or methyl group ($CH_3$), $R_5$ is chain-or-ring-structured aromatic or aliphatic hydrocarbon of C0-C10 containing hetero atom of 1-5, and m is an integer of 200 to 1000.

5. The method for forming fine patterns of semiconductor device as claimed in claim 2, wherein the binder polymer is a homopolymer manufactured by monomer only selected from a group of acryl amide and derivative thereof, acrylic acid, allylamine and derivative thereof, vinyl alcohol and derivative thereof, vinyl sulfonic acid, 4-hydroxy styrene, N-vinyl-2-pyrrolidone, N-vinyl caprolactame and N-vinyl imidazole or copolymer manufactured by 2-4 monomers selected from the group.

6. The method for forming fine patterns of semiconductor device as claimed in claim 2, wherein the solvent is a polar protic solvent, and selected from a group consisting of water, methanol, ethanol, isopropanol(IPA), propaneglycolmonomethylether, isoamylether, ethylactate, normal butanol, normal phentanol, normal hexanol, normal propanol, formamide, formic acid, acetic acid, 4-methyl-2-pentanol and mixture thereof.

7. The method for forming fine patterns of semiconductor device as claimed in claim 2, wherein amount of the binder polymer is 200 to 2,000 weight part with respect to 100 weight part of the cross-linker, and amount of the solvent is 100 to 7,000 weight part with respect to 100 weight part of the binder polymer.

8. The method for forming fine patterns of semiconductor device as claimed in claim 2, wherein the composition for the mirror interlayer further comprises a refractivity enhancer of 1 to 50 weight part with respect to 100 weight part of the binder polymer, and the refractivity enhancer is selected from a group consisting of siloxane compound represented by following Formula 5 and isocyanurate compounds represented by following Formula 6, and the molecular weight thereof is 300 to 100,000,

[Formula 5]
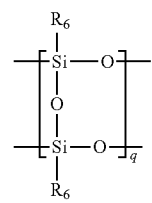

[Formula 6]
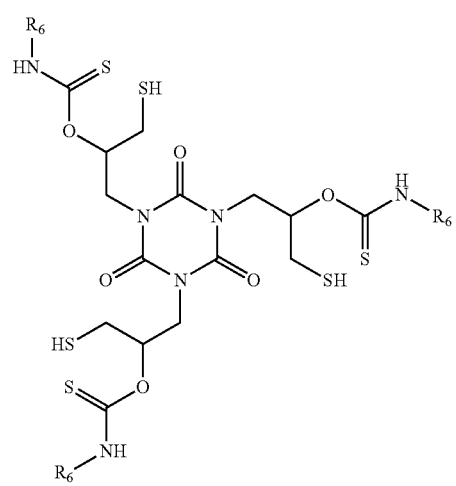

in Formula 5 and Formula 6, $R_6$ is chain-or-ring-structured aromatic or aliphatic hydrocarbon of C1-C19 containing hetero atom of 0-21, and q is an integer of 2 to 1,000.

9. The method for forming fine patterns of semiconductor device as claimed in claim 1, wherein a photoresist composition for forming the first and second photoresist patterns comprises a photosensitive polymer represented by following Formula 7, a photo acid generator and an organic solvent, and a refractive index of the photoresist layer to the light having energy which is lower than a threshold energy ($E_{th}$) of the photoresist layer is smaller than that of the mirror interlayer by 1 to 50%,

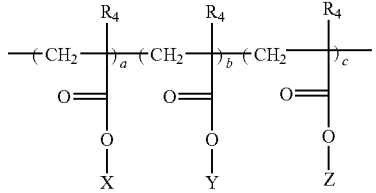
[Formula 7]

in Formula 7, $R_4$ is independently hydrogen atom or methyl group, and X, Y and Z are independently, $C_{1-25}$ chain-or-ring-structured aromatic or aliphatic hydrocarbon containing hetero atom of 0-20, a, b and c independently represent mol % of repeating units with respect total monomers constituting the polymer, and are 10 to 75 mol %, 15 to 80 mol %, and 10 to 75 mol %, respectively.

10. The method for forming fine patterns of semiconductor device as claimed in claim 9, wherein amount of the photo acid generator is 0.05 to 10 weight part with respect to 100 weight part of the photosensitive polymer, and amount of the organic solvent is 100 to 10,000 weight part with respect to 100 weight part of the photosensitive polymer.

11. The method for forming fine patterns of semiconductor device as claimed in claim 9, wherein the photoresist composition further comprises a base compound for regulating acid-diffusion of 0.01 to 5 weight part with respect to 100 weight part of the photosensitive polymer.

12. A composition for forming a mirror interlayer comprising, either a cross-linker or a mixture of a cross-linker, a polymer binder and a solvent, wherein the polymer binder is a polymer containing repeating unit represented following Formula 4 and weight-average molecular weight thereof is 1,000 to 100,000,

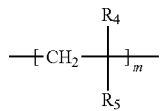
[Formula 4]

in Formula 4, $R_4$ is hydrogen atom or methyl group ($CH_3$), $R_5$ is chain-or-ring-structured aromatic or aliphatic hydrocarbon of C0-C10 containing hetero atom of 1-5, and m is an integer of 200 to 1000, and wherein a refractive index of the mirror interlayer with respect to a light having energy which is lower than a threshold energy (Eth) of a photoresist layer formed on the mirror interlayer is larger than a refractive index of the photoresist layer by 1-50%.

13. The composition for forming a mirror interlayer as claimed in claim 12, wherein the cross-linker is selected from a group consisting of amine type compound represented by following Formula 1, alcohol type compound represented by following Formula 2, amide type compound represented by following Formula 3 and mixture thereof,

[Formula 1]
[Formula 2]
[Formula 3]
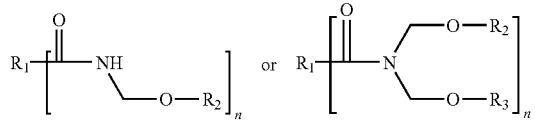

in Formula 1 to Formula 3, $R_1$ is chain-or-ring-structured aromatic or aliphatic hydrocarbon of C1-C10, containing hetero atom of 0-5, $R_2$ and $R_3$ are independently chain-or-ring-structured aromatic or aliphatic hydrocarbon of C1-15, containing hetero atom of 0-5, and n is an integer of 1 to 6.

14. The composition for forming a mirror interlayer as claimed in claim 12, wherein the binder polymer is a homopolymer manufactured by monomer only selected from a group of acryl amide and derivative thereof, acrylic acid, allylamine and derivative thereof, vinyl alcohol and derivative thereof, vinyl sulfonic acid, 4-hydroxy styrene, N-vinyl-2-pyrrolidone, N-vinyl caprolactame and N-vinyl imidazole or copolymer manufactured by 2-4 monomers selected from the group.

15. The composition for forming a mirror interlayer as claimed in claim 12, wherein the solvent is a polar protic solvent, and selected from a group consisting of water, methanol, ethanol, isopropanol(IPA), propaneglycolmonomethylether, isoamylether, ethylactate, normal butanol, normal phentanol, normal hexanol, normal propanol, formamide, formic acid, acetic acid, 4-methyl-2-pentanol and mixture thereof.

16. The composition for forming a mirror interlayer as claimed in claim 12, wherein amount of the binder polymer is 200 to 2,000 weight part with respect to 100 weight part of the cross-linker, and amount of the solvent is 100 to 7,000 weight part with respect to 100 weight part of the binder polymer.

17. The composition for forming a mirror interlayer as claimed in claim 12, wherein the composition for the mirror interlayer further comprises a refractivity enhancer of 1 to 50 weight part with respect to 100 weight part of the binder polymer, and the refractivity enhancer is selected from a group consisting of siloxane compound represented by following Formula 5 and isocyanurate compounds represented by following Formula 6, and the molecular weight thereof is 300 to 100,000,

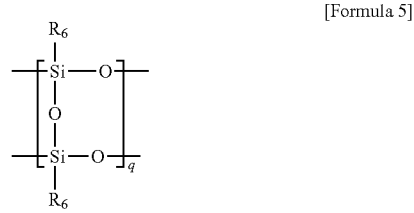
[Formula 5]

[Formula 6]

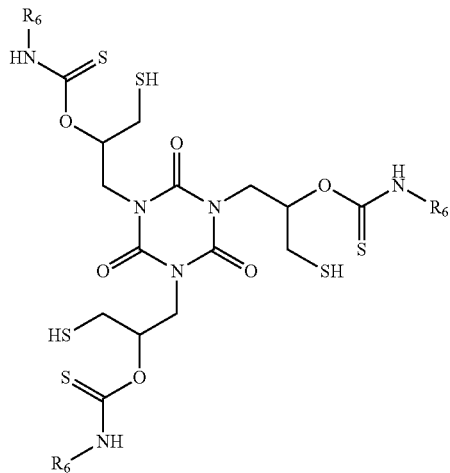

in Formula 5 and Formula 6, $R_6$ is chain-or-ring-structured aromatic or aliphatic hydrocarbon of C1-C19 containing hetero atom of 0-21, and q is an integer of 2 to 1,000.

18. A photoresist composition for forming a photoresist layer comprising: a photosensitive polymer represented by following Formula 7, a photo acid generator, an organic solvent, and a base compound for regulating acid-diffusion of 0.01 to 5 weight part with respect to 100 weight part of the photosensitive polymer, wherein a refractive index of the photoresist layer with respect to a light having energy which is lower than a threshold energy ($E_{th}$) of the photoresist layer is smaller than a refractive index of a mirror interlayer previously formed before the photoresist layer by 1 to 50%,

[Formula 7]

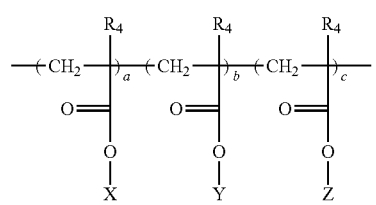

in Formula 7, $R_4$ is independently hydrogen atom or methyl group, and X, Y and Z are independently, $C_{1-25}$ chain-or-ring-structured aromatic or aliphatic hydrocarbon containing hetero atom of 0-20, a, b and c independently represent mol % of repeating units with respect total monomers constituting the polymer, and are 10 to 75 mol %, 15 to 80 mol %, and 10 to 75 mol %, respectively.

19. The photoresist composition for forming a photoresist layer as claimed in claim 18, wherein amount of the photo acid generator is 0.05 to 10 weight part with respect to 100 weight part of the photosensitive polymer, and amount of the organic solvent is 100 to 10,000 weight part with respect to 100 weight part of the photosensitive polymer.

* * * * *